(12) United States Patent
Miyazaki et al.

(10) Patent No.: US 7,746,127 B2
(45) Date of Patent: Jun. 29, 2010

(54) DRIVING DEVICE AND DRIVING METHOD OF CAPACITIVE LOAD AND LIQUID JET PRINTING APPARATUS

(75) Inventors: Shinichi Miyazaki, Suwa (JP); Atsushi Oshima, Shiojiri (JP); Noritaka Ide, Shiojiri (JP); Kunio Tabata, Shiojiri (JP); Hiroyuki Aizawa, Shiojiri (JP); Seiichi Taniguchi, Asahi-mura (JP)

(73) Assignee: Seiko Epson Corporation, Tokyo (JP)

( * ) Notice: Subject to any disclaimer, the term of this patent is extended or adjusted under 35 U.S.C. 154(b) by 49 days.

(21) Appl. No.: 12/325,915

(22) Filed: Dec. 1, 2008

(65) Prior Publication Data

US 2009/0140780 A1    Jun. 4, 2009

(30) Foreign Application Priority Data

Nov. 29, 2007  (JP)  ............................. 2007-308555

(51) Int. Cl.
*H03K 3/00* (2006.01)
(52) U.S. Cl. .................... 327/112; 327/110; 327/111; 323/282; 323/283
(58) Field of Classification Search ......... 327/108–112, 327/387–388, 390–391; 323/282–288
See application file for complete search history.

(56) References Cited

U.S. PATENT DOCUMENTS

RE38,940 E * 1/2006 Isham et al. ................. 323/224
7,259,603 B2 * 8/2007 Gibson et al. ............... 327/170

FOREIGN PATENT DOCUMENTS

| JP | 11-020155   | 1/1999  |
|----|-------------|---------|
| JP | 11-320782   | 11/1999 |
| JP | 2005-329710 | 12/2005 |
| JP | 2007-096364 | 4/2007  |

* cited by examiner

*Primary Examiner*—An T Luu
(74) *Attorney, Agent, or Firm*—Workman Nydegger

(57) ABSTRACT

A driving device of a capacitive load includes a modulator that executes pulse modulation on a drive waveform signal. An inductor performs low-pass filtering on the modulated drive waveform signal and outputs the low-pass filtered signal as a drive signal towards a load capacitor as the capacitive load. A load selection control circuit selects a load capacitor and a dummy load capacitor to be connected to the inductor so that a sum of the capacitances of the selected load capacitor and dummy load capacitor is kept within a predetermined range. A feedback circuit executes a filtering process on the drive signal so that a frequency characteristic of a passing band of the drive signal becomes substantially flat. The resulting signal is provided to the modulator as a feedback signal. The modulator executes the pulse modulation on a difference value between the drive waveform signal and the feedback signal.

9 Claims, 9 Drawing Sheets

DRIVING DEVICE AND DRIVING METHOD OF CAPACITIVE LOAD AND LIQUID JET PRINTING APPARATUS

BACKGROUND

1. Technical Field

The present invention relates to a driving device and a driving method of a capacitive load formed of a load capacitor, and is particularly suitable for a liquid jet printing apparatus adapted to form a predetermined character or graphics by emitting a jet of a minute liquid to form a fine particle (dot) on a medium.

2. Related Art

An inkjet printer as one of such liquid jet printing apparatuses, which is generally low-price and easily provides high quality color prints, has widely been spreading not only to offices but also to general users along with widespread of personal computers or digital cameras.

A device having a liquid jet head provided with a liquid jet nozzle and mounted on a moving member called a carriage to move in a direction intersecting with a conveying direction of a print medium is generally called "a multi-pass printing apparatus." In contrast, a device having a liquid jet head elongated in a direction intersecting with the conveying direction of a print medium and capable of performing printing in a single pass is generally called "a line head printing apparatus."

Incidentally, in the liquid jet printing apparatus of this kind, the drive signal amplified by a power amplifying circuit is applied to a nozzle actuator such as a piezoelectric element to emit a jet of a liquid from a nozzle, and if the drive signal is amplified by an analog power amplifier such as a linearly driven push-pull connected transistor, a substantial power loss is caused, and a large heat sink is required. Therefore, according to JP-A-2005-329710, the drive signal is amplified using a digital power amplifier, thereby reducing the power loss, and eliminating the heat sink.

However, since the actuators such as piezoelectric elements are capacitive loads each having a capacitance, in the case in which the drive signal is amplified using the digital amplifier as disclosed in JP-A-2005-329710, it is required to eliminate the carrier component of the modulated signal to be amplified using an inductor. On this occasion, the inductor and the load capacitor (the capacitive load) are combined to form a filter, moreover the characteristic of the filter varies in accordance with the number of load capacitors connected, and as a result, the drive signal characteristic is varied to vary the liquid jet characteristic. Further, in order for suppressing the resonance of the filter, a damping resistor is usually inserted between the inductor and the load capacitor, and the damping resistor causes a further power loss.

SUMMARY

The invention has an advantage of providing a driving device and a driving method of a capacitive load, capable of suppressing or preventing the variation in the characteristic caused by power amplification with a digital power amplifier, and of avoiding power loss caused by a damping resistor.

A driving device of a capacitive load according to an aspect of the invention includes a modulator adapted to execute pulse modulation on a drive waveform signal, a digital power amplifier adapted to power-amplify the modulated signal obtained by the modulator with a pair of switching elements push-pull connected to each other, an inductor adapted to low-pass filter the amplified digital signal obtained by the digital power amplifier and output the low-pass filtered signal as a drive signal towards at least one load capacitor as the capacitive load, at least one dummy load capacitor, a load selection control circuit adapted to select the load capacitor and the dummy load capacitor to be connected to the inductor, respectively, so that a sum of a capacitance of the load capacitor and a capacitance of the dummy load capacitor to be connected to the inductor is kept within a predetermined range, and a feedback circuit adapted to execute a filtering process on the drive signal so that a frequency characteristic of a passing band of the drive signal output from the inductor to the load capacitor becomes substantially flat, and feedback the signal obtained to the modulator as a feedback signal, and the modulator executes the pulse modulation on a difference value between the drive waveform signal and the feedback signal.

According to the driving device of a capacitive load of this aspect of the invention, since the characteristic variation caused when performing the power amplification using the digital power amplifier can be suppressed or prevented and further, the frequency characteristic of the passing band of the drive signal thus output can be planarized without using the damping resistor by keeping the sum of the capacitance of the load capacitors and the capacitance of the dummy load capacitors connected to the inductor within a predetermined range, the power loss caused by the damping resistor can be avoided.

Further, in the driving device of a capacitive load according to another aspect of the invention, the feedback circuit leads a phase in a band in the vicinity of a resonant frequency of a low-pass filter composed mainly of the inductor, the load capacitor, and the dummy load capacitor.

According to the driving device of a capacitive load of this aspect of the invention, it is possible to assure the stability of the negative feedback control system by compensating the phase delay of the low-pass filter composed mainly of the inductor, the load capacitor, and the dummy load capacitor.

Further, in the driving device of a capacitive load according to still another aspect of the invention, the dummy load capacitor and the load capacitor has the same capacitance as each other, and the number of dummy load capacitors is the same as the number of load capacitors, and one of the load capacitors, one of the dummy load capacitors, and a selection switch adapted to switch between the one of the load capacitors and the one of the dummy load capacitors form a unit load.

According to the driving device of a capacitive load of this aspect of the invention, the total capacitance viewed from the power amplifier side can always be kept substantially constant, and the characteristic variation of the output drive signal can be prevented.

Further, in the driving device of a capacitive load according to still another aspect of the invention, the dummy load capacitor has a capacitance equal to a total capacitance of a plurality of load capacitors, and the number (K) of dummy load capacitors is larger than one, the load selection control circuit is configured to select N ($0 \leq N \leq M$) load capacitors out of all (M) of the load capacitors to connect the selected load capacitors to the inductor, and further select D ($0 \leq D \leq K$) dummy load capacitors out of the K dummy load capacitors to connect the selected dummy load capacitors to the inductor, and the load selection control circuit is further configured to select the load capacitors and the dummy load capacitors to be connected to the inductor, respectively, so that a variation range in a total capacitance of the N load capacitors and the D dummy load capacitors does not exceed a capacitance of one dummy load capacitor in the case in which the number (N) of the load capacitors connected to the inductor varies from 0 to M.

According to the driving device of a capacitive load of this aspect of the invention, the variation in the total capacitance viewed from the power amplifier side can be suppressed within a range of the capacitance of one dummy load capacitor, and further, the number of dummy load capacitors can be reduced, and consequently, the circuit scale can also be reduced.

Further, in the driving device of a capacitive load according to still another aspect of the invention, at least one inverted filter adapted to execute a filtering process on the drive waveform signal so as to reduce a variation in a frequency characteristic of a passing band of the drive signal based on connection information of the load capacitors and the dummy load capacitors to be connected to the inductor by the load selection control circuit, in the case in which the frequency characteristic of the passing band of the drive signal output from the inductor to the load capacitors varies in accordance with the variation in the total capacitance of the load capacitors and the dummy load capacitors connected to the inductor caused by a combination of selections of the load capacitors and the dummy load capacitors connected to the inductor.

According to the driving device of a capacitive load of this aspect of the invention, it becomes possible to suppress or prevent the characteristic variation of the output drive signal while reducing the number of dummy load capacitors and the circuit scale.

Further, in the driving device of a capacitive load according to still another aspect of the invention, the inductor and the load capacitors are connected without a damping resistor intervening in between.

According to the driving device of a capacitive load of this aspect of the invention, the power loss caused by the damping resistor can be avoided.

Further, in the driving device of a capacitive load according to still another aspect of the invention, the load capacitors are piezoelectric elements corresponding to respective nozzles of a liquid jet head.

According to the driving device of a capacitive load of this aspect of the invention, the variation in the liquid jet characteristic from the liquid jet head can be suppressed or even prevented.

Further, the driving method of a capacitive load according to still another aspect of the invention includes the steps of modulating a drive waveform signal, power-amplifying the modulated signal in the modulation step by a pair of switching elements push-pull connected to each other, outputting the amplified digital signal obtained in the power-amplifying step as a drive signal towards at least one load capacitor as the capacitive load after low-pass filtering the amplified digital signal with an inductor, selecting the load capacitor and a dummy load capacitor to be connected to the inductor, respectively, so that a sum of a capacitance of the load capacitor and a capacitance of the dummy load capacitor to be connected to the inductor is kept within a predetermined range, feeding-back the drive signal as a feedback signal after executing a filtering process on the drive signal so that a frequency characteristic of a passing band of the drive signal output from the inductor to the load capacitor becomes substantially flat, and pulse-modulating a difference value between the drive waveform signal and the feedback signal.

According to the driving method of a capacitive load of this aspect of the invention, since the characteristic variation caused when performing the power amplification using the digital power amplifier can be suppressed or prevented and further, the frequency characteristic of the passing band of the drive signal thus output can be planarized without using the damping resistor by keeping the sum of the capacitance of the load capacitors and the capacitance of the dummy load capacitors connected to the inductor within a predetermined range, the power loss caused by the damping resistor can be avoided.

BRIEF DESCRIPTION OF THE DRAWINGS

The invention will now be described with reference to the accompanying drawings, wherein like numbers reference like elements.

DESCRIPTION OF EXEMPLARY EMBODIMENTS

A liquid jet printing apparatus using a driving device of a capacitive load as a first embodiment of the invention will hereinafter be explained.

Figure 1A:
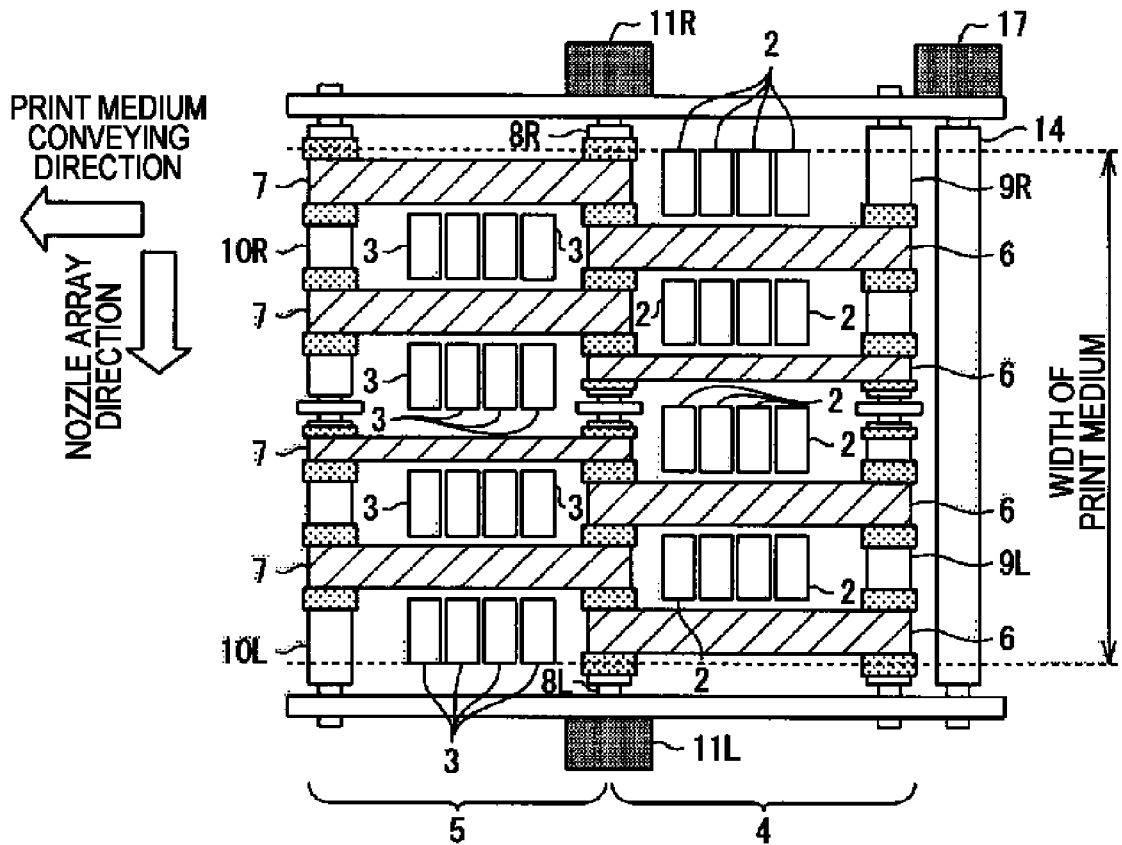
FIG. 1A is a plan view of a schematic configuration of a liquid jet printing apparatus using a driving device of a capacitive load according to an embodiment of the invention.
Figure 1B:
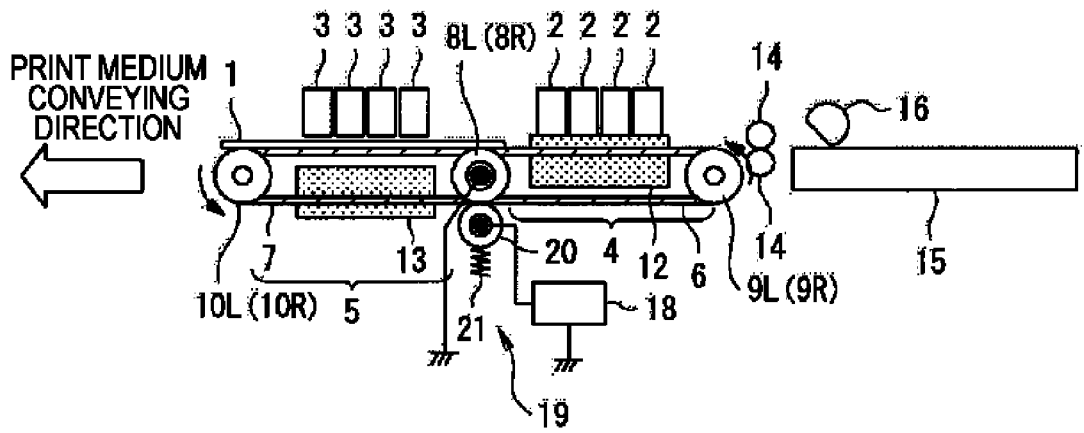
FIG. 1B is a front view of a schematic configuration of the liquid jet printing apparatus using the driving device of a capacitive load according to the embodiment of the invention.

FIGS. 1A and 1B are schematic configuration diagrams of the liquid jet printing apparatus according to the first embodiment, wherein FIG. 1A is a plan view thereof, and FIG. 1B is a front view thereof. In FIGS. 1A and 1B, in a line head printing apparatus, a print medium 1 is conveyed from right to left of the drawing along the arrow direction, and is printed in a print area in the middle of the conveying path.

The reference numeral 2 in the drawing denotes first liquid jet heads disposed on the upstream side in the conveying direction of the print medium 1, the reference numeral 3 denotes second liquid jet heads disposed similarly on the downstream side, a first conveying section 4 for conveying the print medium 1 is disposed below the first liquid jet heads 2, and a second conveying section 5 is disposed below the second liquid jet heads 3. The first conveying section 4 is composed of four first conveying belts 6 disposed with predetermined intervals in the direction (hereinafter also referred to as a nozzle array direction) traversing the conveying direction of the print medium 1, the second conveying section 5 is similarly composed of four second conveying belts 7 disposed with predetermined intervals in the direction (the nozzle array direction) traversing the conveying direction of the print medium 1.

The four first conveying belts 6 and the similar four second conveying belts 7 are disposed alternately adjacent to each other. In the first embodiment, among the conveying belts 6, 7, the two first and second conveying belts 6, 7 in the right side in the nozzle array direction are separated form the two first and second conveying belts 6, 7 in the left side in the nozzle array direction. In other words, an overlapping portion of the two of the first and second conveying belts 6, 7 in the right side in the nozzle array direction is provided with a right side drive roller 8R, an overlapping portion of the two of the first and second conveying belts 6, 7 in the left side in the nozzle array direction is provided with a left side drive roller 8L, right side first driven roller 9R and left side first driven roller 9L are disposed on the upstream side thereof, and right side second driven roller 10R and left side second driven roller 10L are disposed on the downstream side thereof. Although these rollers may seem a series of rollers, actually they are decoupled at the center portion of FIG. 1A.

Further, the two first conveying belts 6 in the right side in the nozzle array direction are wound around the right side drive roller 8R and the right side first driven roller 9R, the two first conveying belts 6 in the left side in the nozzle array direction are wound around the left side drive roller 8L and the left side first driven roller 9L, the two second conveying belts 7 in the right side in the nozzle array direction are wound around the right side drive roller 8R and the right side second driven roller 10R, the two second conveying belts 7 in the left side in the nozzle array direction are wound around the left side drive roller 8L and the left side second driven roller 10L, and further, a right side electric motor 11R is coupled to the right side drive roller 8R, and a left side electric motor 11L is coupled to the left side drive roller 8L.

Therefore, when the right side electric motor 11R rotationally drives the right side drive roller 8R, the first conveying section 4 composed of the two first conveying belts 6 in the right side in the nozzle array direction and similarly the second conveying section 5 composed of the two second conveying belts 7 in the right side in the nozzle array direction move in sync with each other and at the same speed, while the left side electric motor 11L rotationally drives the left side drive roller 8L, the first conveying section 4 composed of the two first conveying belts 6 in the left side in the nozzle array direction and similarly the second conveying section 5 composed of the two second conveying belts 7 in the left side in the nozzle array direction move in sync with each other and at the same speed. It should be noted that by arranging the rotational speeds of the right side electric motor 11R and the left side electric motor 11L to be different from each other, the conveying speeds in the left and right in the nozzle array direction can be set different from each other, and specifically, by arranging the rotational speed of the right side electric motor 11R to be higher than the rotational speed of the left side electric motor 11L, the conveying speed in the right side in the nozzle array direction can be made higher than that in the left side, and by arranging the rotational speed of the left side electric motor 11L to be higher than the rotational speed of the right side electric motor 11R, the conveying speed in the left side in the nozzle array direction can be made higher than that in the right side. Further, by controlling the conveying speeds in the respective sides in the nozzle array direction, namely the direction traversing the conveying direction, the conveying posture of the print medium 1 can be controlled.

The first liquid jet heads 2 and the second liquid jet heads 3 are disposed so as to be shifted from each other in the conveying direction of the print medium 1 corresponding respectively to the colors, yellow (Y), magenta (M), cyan (C) and black (K). The liquid jet heads 2 and the liquid jet heads 3 are supplied with liquids from liquid tanks of respective colors, not shown, via liquid supply tubes. The liquid jet heads 2 and the liquid jet heads 3 are each provided with a plurality of nozzles formed in the direction traversing the conveying direction of the print medium 1, and by emitting a necessary amount of the liquid jet from the respective nozzles simultaneously to the necessary positions, microscopic dots are formed on the print medium 1. By executing the process described above by each of the colors, single-pass print can be achieved only by making the print medium 1 conveyed by the first and second conveying sections 4, 5 pass therethrough once.

As a method of emitting a liquid jet from each of the nozzles of the liquid jet head, there are cited a electrostatic driving method, piezoelectric driving method, a film boiling liquid jet method, and so on, and there is used the piezoelectric driving method in the first embodiment. In the piezoelectric driving method, when a drive signal is provided to a piezoelectric element as an actuator, a diaphragm in a cavity is displaced to cause pressure variation in the cavity, and the liquid jet is emitted from the nozzle in response to the pressure variation. Further, by controlling the wave height and the voltage variation gradient of the drive signal, it becomes possible to control the amount of liquid jet to be emitted therefrom. It should be noted that the actuator formed of a piezoelectric element is a capacitive load having a capacitance.

The nozzles of the first liquid jet head 2 are only provided between the four first conveying belts 6 of the first conveying section 4, and the nozzles of the second liquid jet head 3 are only provided between the four second conveying belts 7 of the second conveying section 5. Although this is for cleaning the liquid jet heads 2 and the liquid jet heads 3 with respective cleaning sections described later, in this case, the single-pass printing of the entire surface is not achievable if either one of the liquid jet heads 2 and 3 is used. Therefore, the first liquid jet heads 2 and the second liquid jet heads 3 are disposed shifted in the conveying direction of the print head 1 in order for compensating for each other's unprintable areas.

Below the first liquid jet heads 2, there are disposed first cleaning caps 12 for cleaning the first liquid jet heads 2, and below the second liquid jet heads 3 there are disposed second cleaning caps 13 for cleaning the second liquid jet heads 3. Each of the cleaning caps 12 and the cleaning caps 13 is formed to have a size allowing the cleaning caps to pass through between the four first conveying belts 6 of the first conveying section 4 and between the four second conveying belts 7 of the second conveying section 5. The cleaning caps 12 and the cleaning caps 13 are each composed of a cap body having a rectangular shape with a bottom, covering the nozzles provided to the lower surface, namely a nozzle surface of respective one of the liquid jet heads 2 and the liquid jet heads 3, and capable of adhering to the nozzle surface, a liquid absorbing body disposed at the bottom thereof, a peristaltic pump connected to the bottom of the cap body, and an elevating device for moving the cap body up and down. Then, the cap body is moved up by the elevating device to adhere to the nozzle surface of respective one of the liquid jet heads 2 and the liquid jet heads 3. By causing the negative pressure in the cap body using the peristaltic pump in the present state, the liquid and bubbles are suctioned from the nozzles opened on the nozzle surface of respective one of the liquid jet heads 2 and the liquid jet heads 3, thus the cleaning of respective one of the liquid jet heads 2 and the liquid jet heads 3 can be performed. After the cleaning is completed, each of the cleaning caps 12 and the cleaning caps 13 is moved down.

On the upstream side of the first driven roller 9R and the driven roller 9L, there are provided two gate rollers 14 forming a pair for adjusting the feed timing of the print medium 1 fed from a feeder section 15 and at the same time correcting the skew of the print medium 1. The skew denotes a turn of the print medium 1 with respect to the conveying direction. Further, above the feeder section 15, there is provided a pickup roller 16 for feeding the print medium 1. It should be noted that the reference numeral 17 in the drawing denotes a gate roller motor for driving the gate rollers 14.

A belt charging device 19 is disposed below the drive roller 8R and the drive roller 8L. The belt charging device 19 is composed of charging rollers 20 each having contact with the first conveying belts 6 and the second conveying belts 7 by pinching the first conveying belts 6 and the second conveying belts 7 between the charging rollers and the drive rollers 8R, 8L, a spring 21 for pressing the charging rollers 20 against the first conveying belts 6 and the second conveying belts 7, and a power supply 18 for providing charge to the charging rollers 20, and charges the first conveying belts 6 and the second conveying belts 7 by providing the first conveying belts 6 and the second conveying belts 7 with the charge from the charging rollers 20. Since the first conveying belts 6 and the second conveying belts 7 are generally made of a moderate or high resistivity material or an insulating material, when they are charged by the belt charging device 19, the charge applied on the surface thereof causes the dielectric polarization on the print medium 1 made similarly of a high resistivity material or an insulating material, and the print medium 1 can be absorbed to the belt by the electrostatic force caused between the charge generated by the dielectric polarization and the charge on the surface of the belt. It should be noted that as the charging method, a corotron method for showering the charges can also be used.

Therefore, according to the liquid jet printing apparatus of the first embodiment, when the surfaces of the first conveying belts 6 and the second conveying belts 7 are charged by the belt charging device 19, the print medium 1 is fed from the gate roller 14 in that state, and the print medium 1 is pressed against the first conveying belts 6 by a sheet pressing roller, not shown, the print medium 1 is absorbed by the surfaces of the first conveying belts 6 under the action of dielectric polarization described above. In this state, when the electric motors 11R, 11L rotationally drive the drive roller 8R and the drive roller 8L, the rotational driving force is transmitted to the first driven rollers 9R and 9L via the first conveying belts 6.

Thus, while the first conveying belts 6 are moved to the downstream side of the conveying direction with the print medium 1 absorbed thereto to move the print medium below the first liquid jet heads 2, printing is performed by emitting liquid jets from the nozzles provided to the first liquid jet heads 2. When the printing by the first liquid jet heads 2 is completed, the print medium 1 is moved towards downstream side in the conveying direction to be transferred to the second conveying belts 7 of the second conveying section 5. As described above, since the second conveying belts 7 are also provided with the charge on the surface thereof by the belt charging device 19, the print medium 1 is absorbed by the surfaces of the second conveying belts 7 under the action of the dielectric polarization.

In the present state, while the second conveying belts 7 is moved towards the downstream side in the conveying direction to move the print medium 1 below the second liquid jet heads 3, printing is performed by emitting liquid jets from the nozzles provided to the second liquid jet heads 3. After the printing by the second liquid jet heads 3 is completed, the print medium 1 is moved further to the downstream side in the conveying direction, the print medium 1 is ejected to a catch tray while separating it from the surfaces of the second conveying belts 7 by a separating device not shown in the drawings.

Further, when the cleaning of the first liquid jet heads 2 and second liquid jet heads 3 becomes necessary, the first cleaning caps 12 and the second cleaning caps 13 are raised to adhere to the nozzle surfaces of the first liquid jet heads 2 and the second liquid jet heads 3, and the cleaning is performed by applying negative pressure to the inside of the caps at that state to suction the liquid and the bubbles from the nozzles of the first liquid jet heads 2 and the second liquid jet heads 3, and after then, the first cleaning caps 12 and the second cleaning caps 13 are moved down as described above.

Figure 2:
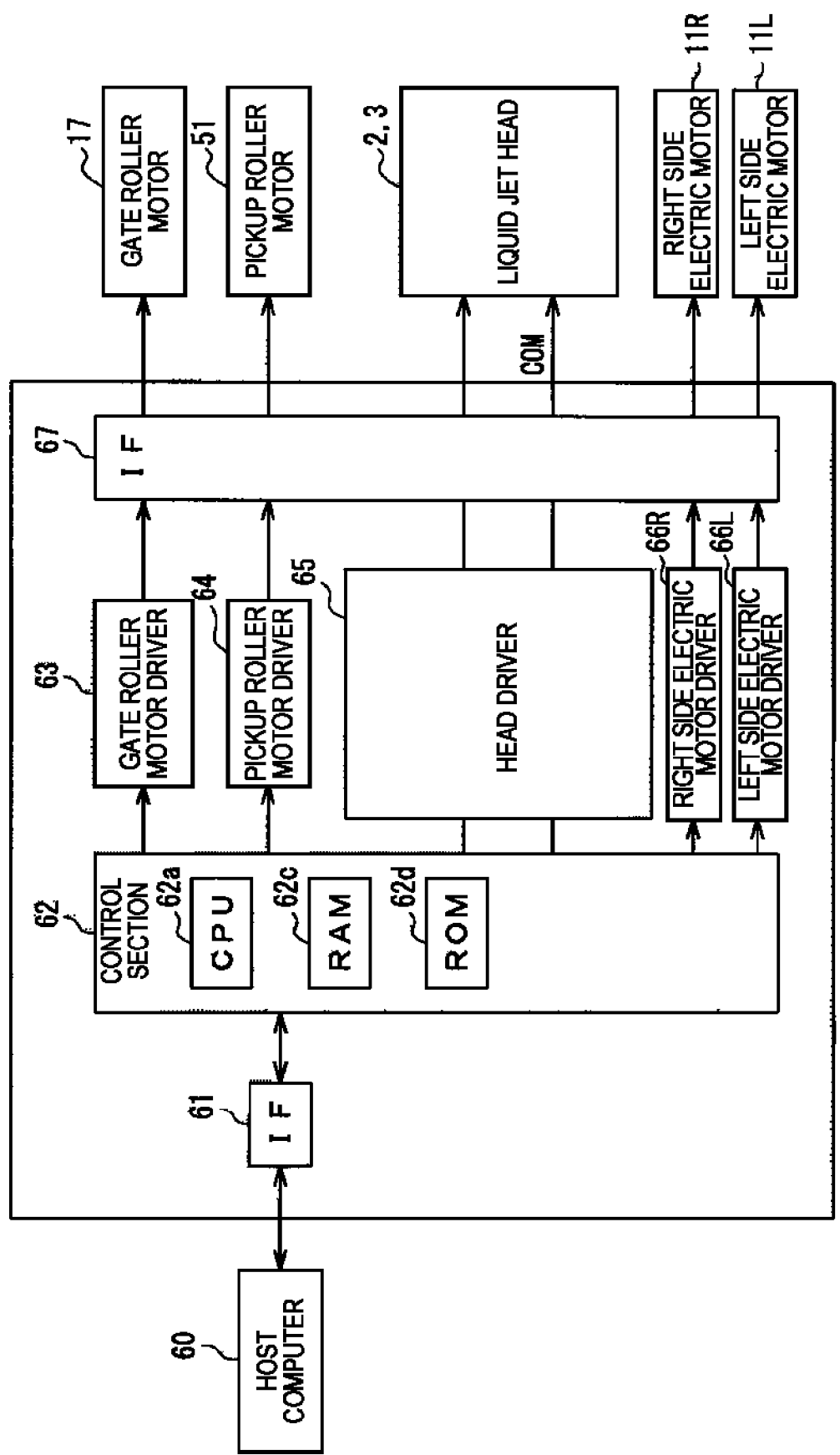
FIG. 2 is a block diagram of a control device of the liquid jet printing apparatus shown in FIGS. 1A and 1B.

Inside the liquid jet printing apparatus, there is provided a control device for controlling the liquid jet printing apparatus. As shown in FIG. 2, the control device is configured including an input interface 61 for receiving print data input from the host computer 60, a control section 62 formed of a microcomputer for performing the print process based on the print data input from the input interface 61, a gate roller motor driver 63 for controlling and driving the gate roller motor 17, a pickup roller motor driver 64 for controlling and driving a pickup roller motor 51 for driving the pickup roller 16, a head driver 65 for controlling and driving the liquid jet heads 2 and the liquid jet heads 3, a right side electric motor driver 66R for controlling and driving the right side electric motor 11R, a left side electric motor driver 66L for controlling and driving the left side electric motor 11L, and an interface 67 for connecting the gate roller motor driver 63, the pickup roller motor driver 64, the head driver 65, the right side electric motor driver 66R, and the left side electric motor driver 66L respectively to the gate roller motor 17, the pickup roller motor 51, the liquid jet heads 2, the liquid jet heads 3, the right side electric motor 11R, and the left side electric motor 11L.

The control section 62 is provided with a central processing unit (CPU) 62a for performing various processes such as a printing process, a random access memory (RAM) 62c for temporarily storing the print data input via the input interface 61 and various kinds of data used in performing the printing process of the print data, and for temporarily developing an application program such as for the printing process, and a read-only memory (ROM) 62d formed of a nonvolatile semiconductor memory and for storing the control program executed by the CPU 62a, and so on. When the control section 62 receives the print data (the image data) from the host computer 60 via the interface section 61, the CPU 62a executes a predetermined process on the print data to calculate nozzle selection data and drive signal output data regarding which nozzle emits the liquid jet or how much liquid jet is emitted, and further outputs the control signals and the drive signals to the gate roller motor driver 63, the pickup roller motor driver 64, the head driver 65, the right side electric motor driver 66R, and the left side electric motor driver 66L, respectively, based on the print data, drive signal output data, and the input data from the various sensors. In response to the drive signals and the control signals, the nozzle actuators 22 corresponding to the plurality of nozzles of the liquid jet heads 2 and the liquid jet heads 3, the gate roller motor 17, the pickup roller motor 51, the right side electric motor 11R, and the left side electric motor 11L respectively operate to execute the feeding and conveying of the print medium 1, the posture control of the print medium 1, and the printing process on the print medium 1. It should be noted that the elements inside the control section 62 are electrically connected to each other via a bus not shown in the drawings.

Figure 3:
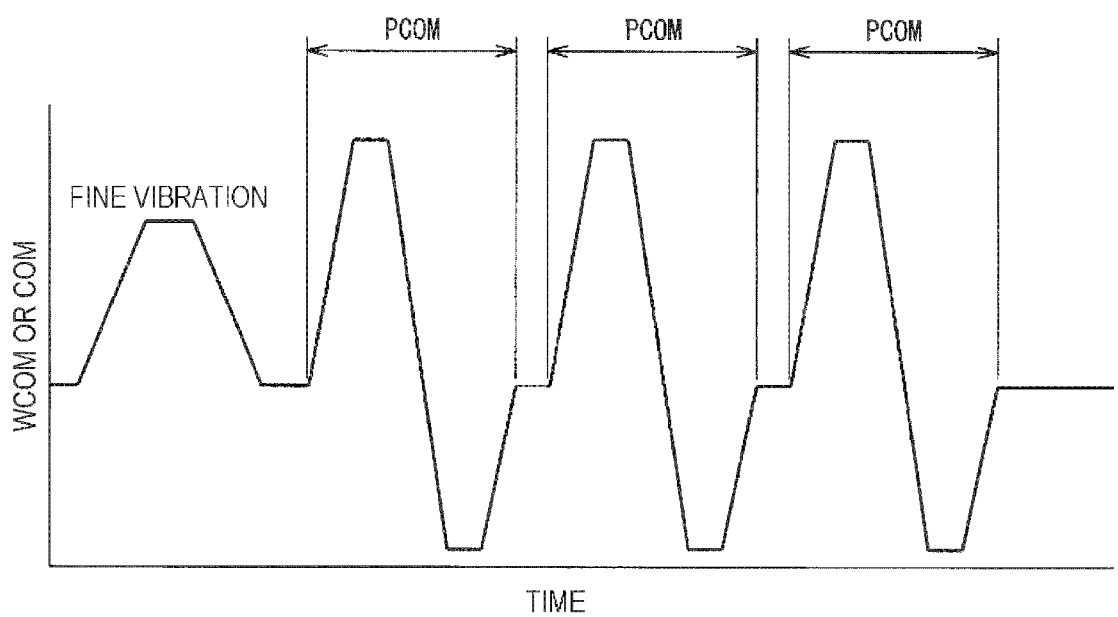
FIG. 3 is an explanatory diagram of a drive signal for driving a nozzle actuator.

FIG. 3 shows an example of a drive signal COM supplied from the control device of the liquid jet printing apparatus according to the first embodiment to the liquid jet heads 2 and the liquid jet heads 3 and for driving the nozzle actuators each formed of a piezoelectric element. In the first embodiment, a signal with the electric potential centering around a midpoint potential. The drive signal COM is formed by connecting drive pulses PCOM as a unit drive signal for driving the nozzle actuator so as to emit a liquid jet in a time-series manner, wherein the rising section of each of the drive pulses PCOM corresponds to a stage of expanding the volume of the cavity (the pressure chamber) communicating with the nozzle to take in the liquid, as a result of pushing out the liquid, the liquid jet is emitted from the nozzle.

Therefore, in the case in which a plurality of drive pulses PCOM are sequentially joined, it is possible that the single drive pulse PCOM is selected from such drive pulses to be supplied to the actuator to emit the liquid jet, or a plurality of drive pulses PCOM is selected and supplied to the actuator to emit the liquid jet a plurality of times, thereby obtaining the dots with various sizes. In other words, when a plurality of liquid droplets land on the same position while the liquid is not dried, it brings substantially the same result as emitting a larger amount of liquid jet, thus the size of the dot can be enlarged. By a combination of such technologies, multiple tone printing can be achieved. It should be noted that by variously changing the voltage variation gradient and the wave height of the drive pulse PCOM formed of the trapezoidal voltage wave, the pull-in amount and the pull-in speed of the liquid, and the push-out amount and the push-out speed of the liquid can be changed, thus the amount of liquid jet can be changed to obtain the dots with different sizes, thereby making it possible to promote the multiple tone printing. Further, the drive signal COM shown in the left end of FIG. 3 is only for pulling in the liquid but not for pushing out the liquid. This is called a fine vibration, and is used for preventing the nozzle from drying without emitting the liquid jet.

Figure 4:
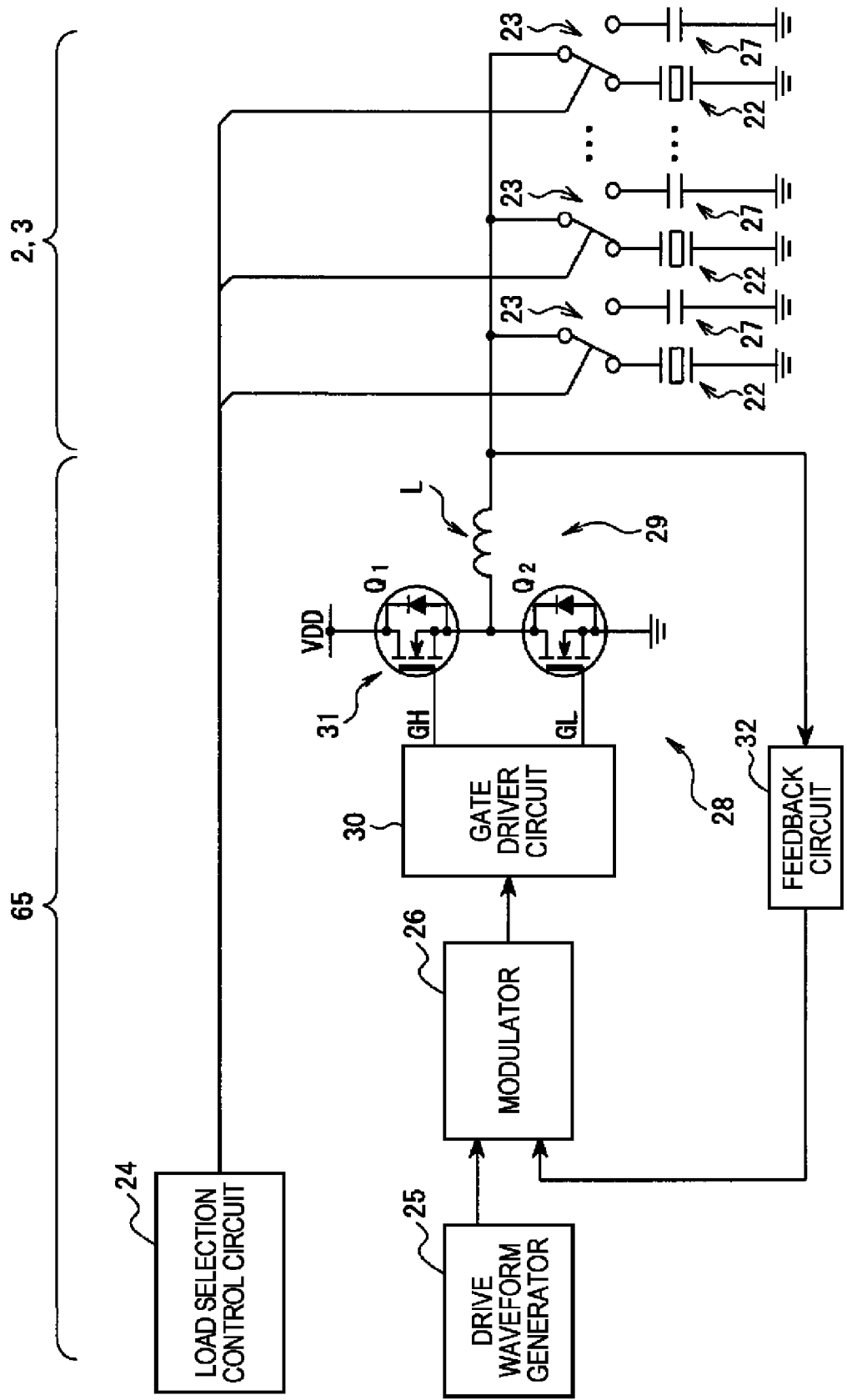
FIG. 4 is a block diagram showing a first embodiment of the driving device of a capacitive load.

FIG. 4 shows an example of a specific configuration of the head driver 65, the liquid jet heads 2, and the liquid jet heads 3. The reference numeral 22 in the drawing denotes the nozzle actuators each formed of a piezoelectric element, which are provided in correspondence with a number of nozzles provided to the liquid jet heads 2 and the liquid jet heads 3. In the first embodiment, the dummy load capacitors 27 are provided in one-to-one correspondence with these nozzle actuators 22. The dummy load capacitors 27 each have the same capacitance as that of the nozzle actuator 22, and it is arranged that the nozzle actuator 22 and the dummy load capacitor 27 forming a pair can be switched by a selection switch 23. Specifically, in the first embodiment, the capacitance of one of the nozzle actuators 22, one of the dummy load capacitors 27, and one of the selection switches 23 form a unit load to a drive signal output circuit described later, and the selection switch 23 is used as a switching element.

The selection switch 23 is switched by a load selection control circuit 24. The load selection control circuit 24 switches the selection switch 23 so that the drive pulse PCOM is applied to the nozzle actuator 22 in the necessary period of the drive pulse PCOM in the drive signal COM in the case in which the drive signal COM has the drive pulses PCOM in a time-series manner as shown in FIG. 3 based on the nozzle selection data from the control section 62. In the case in which no drive pulse PCOM is applied to the nozzle actuator 22, the drive pulses are applied to the dummy load capacitor 27, and since the dummy load capacitor 27 has the same capacitance as that of the nozzle actuator 22, the total load capacitance viewed from the digital power amplifier described later is always constant. By adopting the configuration described above, in the case in which the drive signal COM includes a plurality of drive pulses, the total load capacitance of the dummy load capacitor 27 and the nozzle actuator 22 can be kept constant in every drive pulse period.

Meanwhile, the drive signal output circuit is configured including a drive waveform generator 25 for generating a drive waveform signal WCOM forming a base of the drive signal COM, namely a reference of a signal for controlling driving of the actuators based on the drive signal output data from the control section 62, a modulator 26 for executing pulse modulation on the drive waveform signal WCOM generated by the drive waveform generator 25, a digital power amplifier 28 for amplifying the modulated signal on which the pulse modulation is executed by the modulator 26, a low-pass filter 29 for smoothing the amplified digital signal amplified by the digital power amplifier 28 and supplying the nozzle actuators 22 with the amplified digital signal thus smoothed as the drive signal COM, and a feedback circuit 32 for negatively feeding-back the drive signal COM output from the low-pass filter 29 to the modulator 26.

The drive waveform generator 25 combines a predetermined digital data in a time-series manner to output the combination as the drive waveform signal WCOM. As the modulator 26 for performing the pulse modulation on the drive waveform signal WCOM, there is used a typical pulse width modulation (PWM) circuit. It should be noted that it also possible to use a pulse density modulation (PDM) circuit, a pulse frequency modulation (PFM) circuit, a pulse phase modulation (PPM) circuit, and so on instead of the pulse width modulation circuit. The digital power amplifier 28 is configured including a half-bridge output stage 31 formed of a high-side switching element (MOSFET) Q1 and a low-side switching element (MOSFET) Q2 for substantially amplifying the power, and a gate driver circuit 30 for controlling a gate-source signal GH of the switching element (MOSFET) Q1 and a gate-source signal GL of the switching element (MOSFET) Q2 based on the modulated signal from the modulator 26. Further, although the low-pass filter 29 of the first embodiment is provided only with a coil (the inductor) L, the low-pass filter is formed by the coil in combination with the capacitance of the nozzle actuator 22 or the dummy load capacitor 27 to be connected to the output thereof, and the carrier component of the amplified digital signal is eliminated by this low-pass filter.

In the digital power amplifier 28, when the modulated signal is in the high level, the gate-source signal GH of the high-side switching element Q1 becomes in the high level and the gate-source signal GL of the low-side switching element Q2 becomes in the low level, and consequently, the high-side switching element Q1 becomes in the ON state and the low-side switching element Q2 becomes in the OFF state, and as a result, the output voltage of the half-bridge output stage 31 becomes equal to the power supply voltage VDD. On the other hand, when the modulated signal is in the low level, the gate-source signal GH of the high-side switching element Q1 becomes in the low level and the gate-source signal GL of the low-side switching element Q2 becomes in the high level, and consequently, the high-side switching element Q1 becomes in the OFF state and the low-side switching element Q2 becomes in the ON state, and as a result, the output voltage of the half-bridge output stage 31 becomes equal to the ground voltage, namely 0.

As described above, although when the high-side and low-side switching elements are driven digitally, a current flows through the switching element in ON state, the resistance value between the drain and the source in the switching elements (MOSFET) is extremely small, and therefore, the loss is hardly caused. Further, since a current hardly flows through the switching element in the OFF state, the loss is hardly caused. Therefore, since the loss of the digital power amplifier 28 is extremely small, a switching element such as a small-sized MOSFET can be used therefor, and a cooling section such as a heat radiation plate for cooling can also be eliminated. Incidentally, the efficiency in the case in which the transistor is driven in the linear range is about 30% while the efficiency of digital power amplifier is 90% or higher. Further, since the heat radiation plate for cooling the transistor requires about 60 mm square in size for each transistor, if such a radiation plate can be eliminated, an overwhelming advantage in the actual layout can be obtained.

Figure 5:
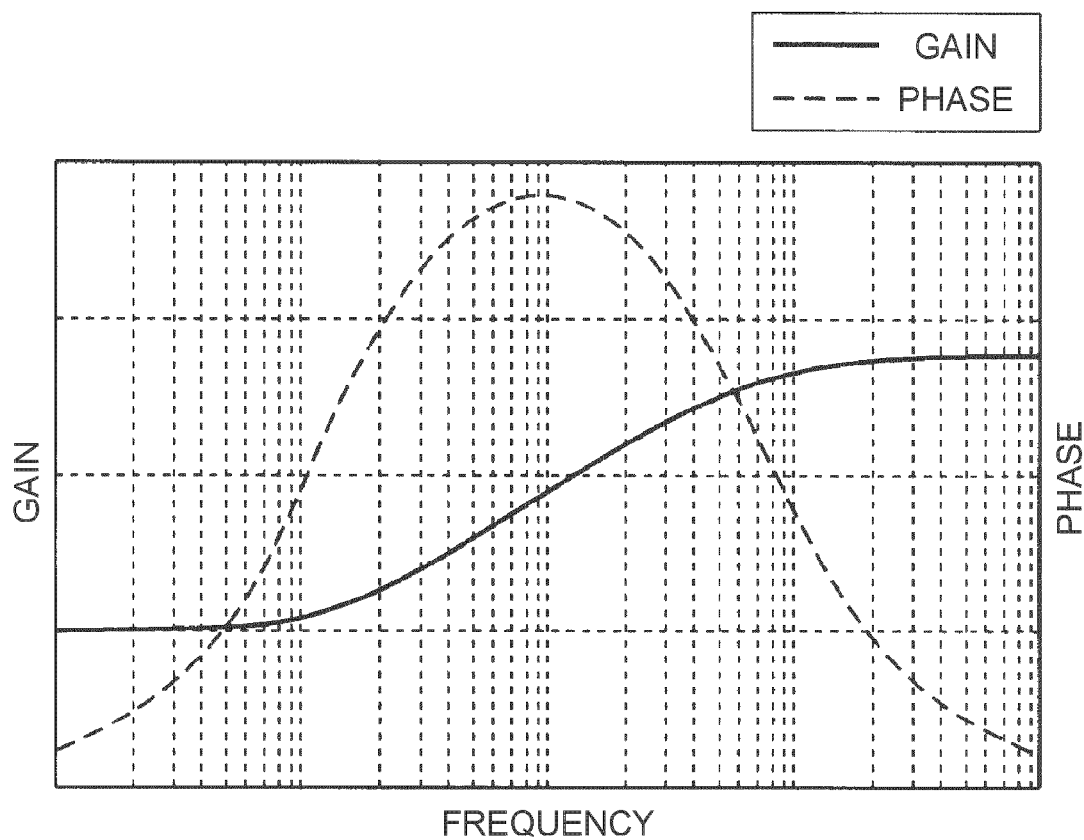
FIG. 5 is an explanatory diagram of a characteristic of a feedback circuit used for the driving device of a capacitive load shown in FIG. 4.

The feedback circuit 32 is required to have a characteristic of compensating the phase delay of the low-pass filter formed of a combination of the coil (the inductor) L of the low-pass filter 29 and the capacitance of the nozzle actuator 22 or the dummy load capacitor 27 to lead the phase of the drive signal COM. By compensating the phase delay using the feedback circuit 32, it is possible to prevent the oscillation of the feedback system to improve the stability. The feedback circuit 32 becomes to have the frequency characteristic of leading the phase in the resonant frequency band where the gain increases as shown in FIG. 5. Further, the feedback circuit 32 having such a characteristic performs a filtering process in which the frequency characteristic of the passing band of the drive signal COM the coil (the inductor) L outputs to the capacitance of the nozzle actuator 22 or the dummy load capacitor 27 is flat, and the signal is fed-back to the modulator 26 as a negative feedback signal. It should be noted that the negative feedback signal is digitalized by the A/D converter provided to the feedback circuit 32, and the difference value between the digital data thus obtained and the digital data of the drive waveform signal WCOM is input to the modulator 26. Further, it is possible to use a V-F conversion circuit instead of the A/D conversion function.

Since the drive signal COM is fed-back negatively to the modulator 26, the modulator 26 executes the pulse modulation substantially on the difference value between the digital data of the drive waveform signal WCOM and the digital data of the drive signal COM thus fed-back negatively. It should be noted that it is possible that the drive waveform signal WCOM is converted into an analog signal by a D/A converter, and the pulse modulation is executed on the difference value between the drive waveform signal WCOM as the analog data and the drive signal COM remaining as an analog signal by the modulator 26 formed of an analog operational amplifier composed of an operational amplifier, a comparator, and so on.

Figure 6:
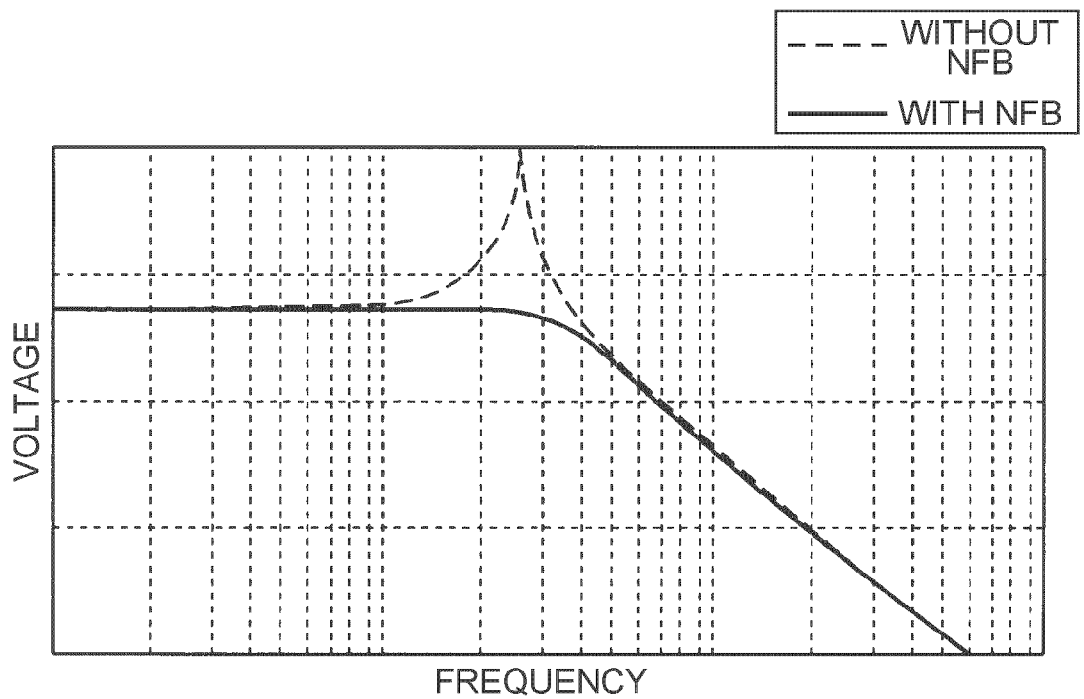
FIG. 6 is a diagram showing an example of a frequency characteristic of an output drive signal output from the driving device of a capacitive load shown in FIG. 4.

In the first embodiment, as shown in FIG. 4, no damping resistor for attenuating a rapid change in an output signal such as the drive pulse PCOM in the first embodiment is inserted between the coil (the inductor) L of the low-pass filter 29 and the capacitive load such as the capacitance of the nozzle actuator 22 or the dummy load capacitor 27. The coil (the inductor) L and the capacitance of the nozzle actuators 22 or the dummy load capacitor 27 are connected directly without the damping resistor intervening in between. In FIG. 6, the broken line illustrates the gain-frequency characteristic of the output signal output in the case in which no damping resistor is inserted between the inductor and the capacitance, and no negative feedback is provided (WITHOUT NFB in FIG. 6). As is obvious from FIG. 6, there is caused a rapid change in the characteristic in the output signal with no damping resistor inserted and no negative feedback provided. In contrast, as in the first embodiment the gain-frequency characteristic of the output signal output in the case in which no damping resistor is inserted, and the negative feedback is provided (WITH NFB in FIG. 6) is illustrated with the solid line in FIG. 6. As is obvious from FIG. 6, in the output signal with no damping resistor inserted and the negative feedback provided, the rapid characteristic change is planarized although depending on the characteristic setting of the feedback circuit 32. By inserting the damping resistor, the rapid characteristic change in the output signal can be attenuated without using the negative feedback. However, attenuation of the characteristic change, which should originally be generated, directly causes the power loss, and insertion of the damping resistor leads the power loss. In contrast, by performing the negative feedback for planarizing the output characteristic, the present embodiment can do without the damping resistor or with a minute damping resistor, it becomes possible to reduce the power loss.

As described above, according to the driving device and the driving method of a capacitive load according to the first embodiment, when the amplified digital signal obtained by amplifying the modulated signal of the drive waveform signal WCOM for driving the plurality of nozzle actuators 22 by the pair of switching elements connected to each other in a push-pull manner is planarized by the coil (the inductor) L and output to the plurality of nozzle actuators 22, since either one of the capacitance of the nozzle actuator 22 and the dummy load capacitor 27 to be connected to the coil (the inductor) L is selected so that the sum of the capacitance of the nozzle actuators 22 and the dummy load capacitors 27 connected to the coil (the inductor) L is kept within a predetermined range, and the filtering process is executed on the drive signal COM (the drive pulse PCOM) and the drive signal COM (the drive pulse PCOM) on which the filtering process is executed is then fed-back so that the frequency characteristic of the passing band of the drive signal COM (the drive pulse PCOM) output from the coil (the inductor) L to the capacitance of the nozzle actuator 22 becomes flat, and the pulse modulation is executed on the difference value between the feedback signal and the drive waveform signal WCOM, by keeping the sum of the capacitance of the nozzle actuators 22 and the dummy load capacitors 27 connected to the coil (the inductor) L within a predetermined range, the variation in the characteristic caused when performing power amplification using the digital power amplifier 28 can be suppressed or prevented, and further, the frequency characteristic of the passing band of the drive signal COM (the drive pulse PCOM) thus output can be planarized without using the damping resistor, thus the power loss caused by the damping resistor can be avoided.

Further, by adopting the feedback circuit 32 having a characteristic of leading the phase in the band in the vicinity of the resonant frequency of the low-pass filter composed of the coil (the inductor) L, the capacitance of the nozzle actuators 22, and the dummy load capacitors 27, it is possible to compensate the phase delay of the low-pass filter, thus the stability of the negative feedback control system can be assured.

Further, the same number of dummy load capacitors 27 as the number of nozzle actuators 22, each having the same capacitance as that of the nozzle actuator 22 are provided, and the capacitance of one of the nozzle actuators 22, one of the dummy load capacitors 27, and one selecting switch 23 for switching the capacitance of one of the nozzle actuators 22 and the one of the dummy load capacitors 27 form one unit load, thus the total load capacitance viewed from the digital power amplifier 28 side can always be kept constant, and the characteristic change in the output drive signal COM can be prevented.

Further, by connecting the coil (the inductor) L and the capacitance of the nozzle actuators 22 to each other without the damping resistor intervening therebetween, the power loss caused by the damping resistor can be avoided.

Further, by using nozzle actuators corresponding to the nozzles of the liquid jet heads 2 and the liquid jet heads 3 as the load capacitance, the variation in the liquid jet characteristic of the liquid jet heads 2 and the liquid jet heads 3 can be suppressed or prevented.

Figure 7:
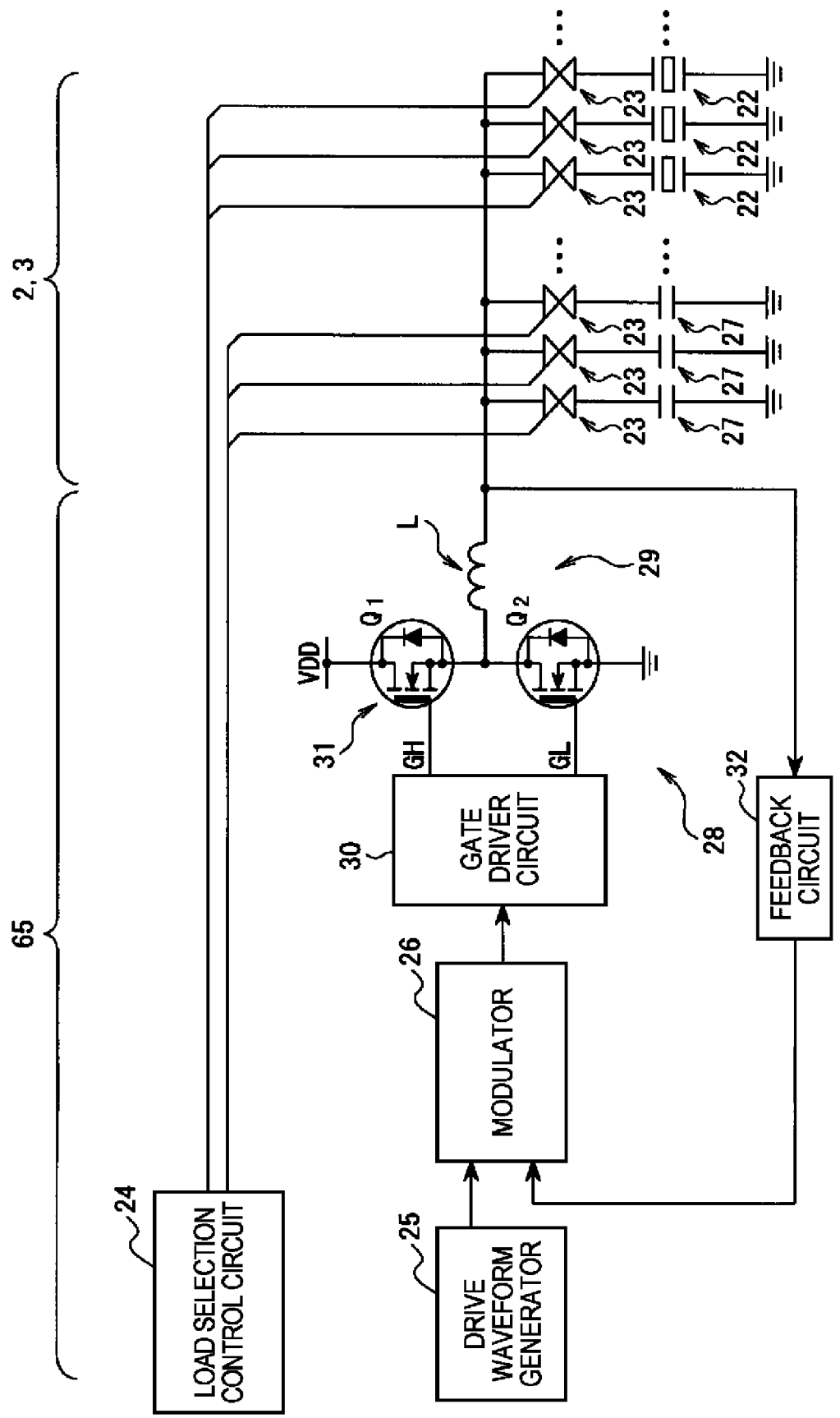
FIG. 7 is a block diagram showing a second embodiment of the driving device of a capacitive load.

Hereinafter, as the driving device of a capacitive load applied to the liquid jet printing apparatus of a second embodiment of the invention, FIG. 7 shows another example of a specific configuration of the head driver 65, the liquid jet heads 2, and the liquid jet heads 3. FIG. 7 includes a number of constituents identical to those of the configuration shown in FIG. 4, and since those constituents essentially have substantially the same functions, the equivalent constituents are denoted with the equivalent numeral references, and the detailed explanation therefor will be omitted. The drive waveform signal generator 25, the modulator 26, the digital power amplifier 28, the low-pass filter 29 in the second embodiment have substantially the same functions as those shown in FIG. 4, and the feedback circuit 32 having substantially the same function as that shown in FIG. 4 is adopted.

In the second embodiment, the dummy load capacitors 27 have different capacitance from that of the nozzle actuators 22. Specifically, the capacitance of each of the dummy load capacitor 27 is made corresponding to the capacitance of J nozzle actuators 22. Here, it is assumed that the total number M of the nozzle actuators 22 is 360, and the case in which the capacitance of each of the dummy load capacitors 27 corresponds to the capacitance of 90 (=J) nozzle actuators 22 will be explained.

The total number K of the dummy load capacitors 27 is obtained by dividing the total number M of the nozzle actuators 22 by J and further subtracting 1 therefrom, namely by the formula K=(M/J)−1, and in this case, K is obtained as 3. Further, the selection switch 23 is provided in correspondence with all of the capacitances of the nozzle actuators 22 and the dummy load capacitors 27. The selection switches 23 are each formed of a transmission gate or the like. The selection switches 23 are individually ON/OFF controlled by the load selection control circuit 24. The load selection control circuit 24 switches the selection switches 23 ON or OFF so that the necessary drive pulses PCOM are applied to the nozzle actuators 22 in the case in which the drive signal COM has the drive pulses PCOM in a time-series manner as shown in FIG. 3 based on the nozzle selection data from the control section 62. In other words, the ON/OFF control of the selection switch 23, namely the selection control of the nozzle actuators 22 on this occasion is performed for every drive pulse PCOM. Here, if the number of selection switch 23 corresponding to the nozzle actuators 22 to be switched ON is N, the load selection control circuit 24 switches ON the selection switches 23 corresponding to D dummy load capacitors, wherein D is obtained by the following formula. D=K−trunc{(N−1)/J}

Here, trunc{ } denotes a function of truncating the decimal fraction and returning the integer part. If the number N of the selection switches 23 corresponding to the nozzle actuators 22 to be switched ON is 100, D=3−trunc(99/90)=2 is obtained, and therefore, the selection switches 23 corresponding to the 2 dummy load capacitors 27 are switched ON. It is obvious that the ON/OFF control of the selection switches 23, namely the selection control of the dummy load capacitors 27 on this occasion is also performed for every drive pulse PCOM.

Figure 8A:
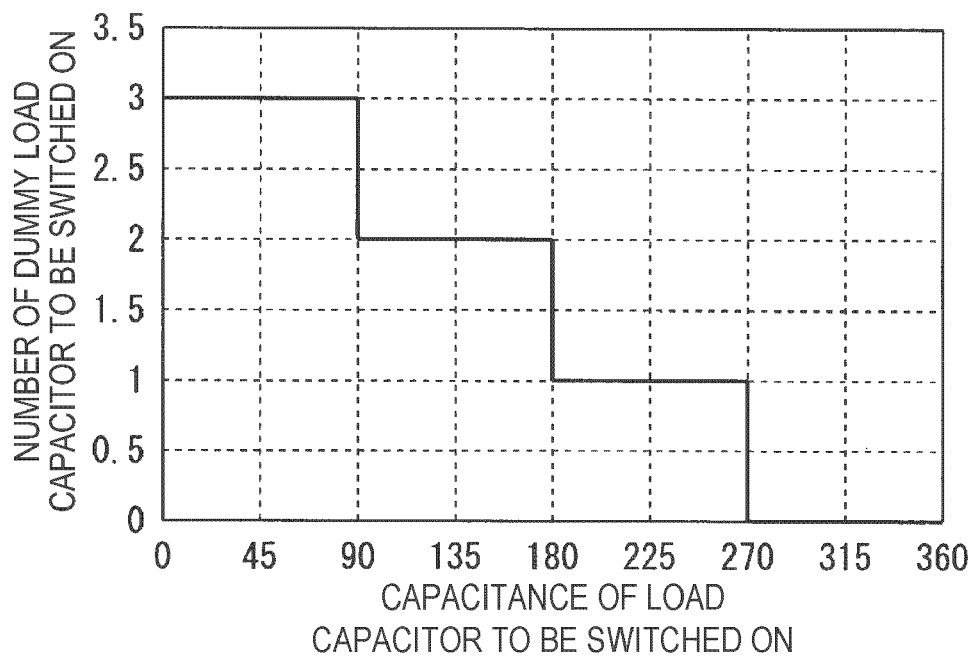
FIG. 8A is a diagram for explaining the number of dummy load capacitors switched on by the driving device of a capacitive load shown in FIG. 7.
Figure 8B:
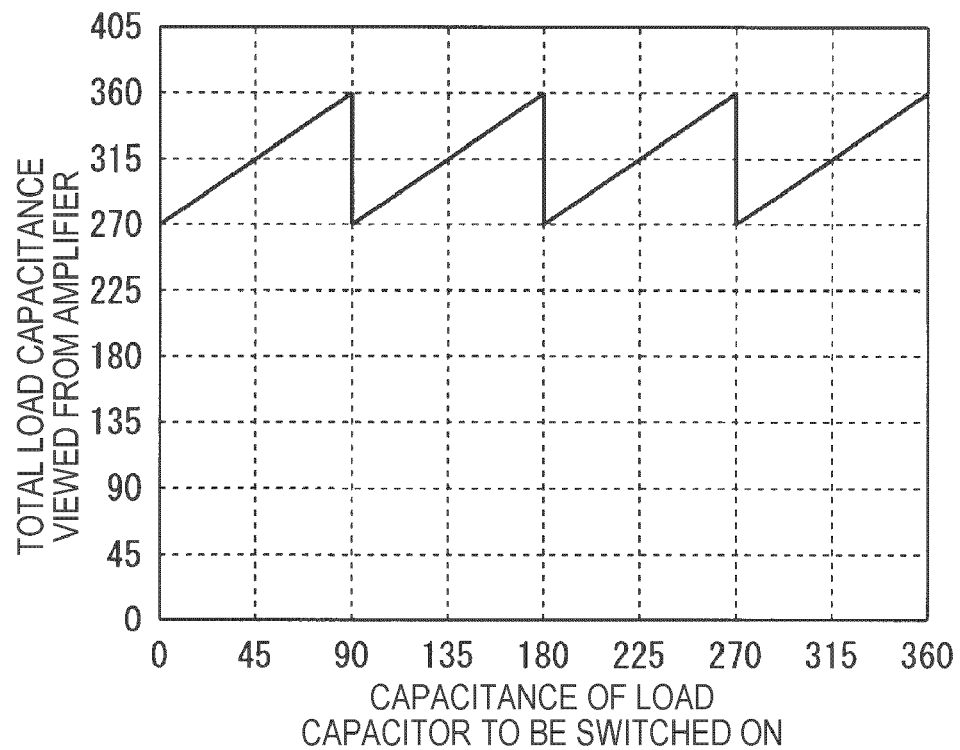
FIG. 8B is a diagram for explaining a total load capacitance viewed from the power amplifier side in the driving device of a capacitive load shown in FIG. 7.

By changing the number D of the selection switches 23 corresponding to the dummy load capacitors 27 to be switched ON in accordance with the number N of the selection switches 23 corresponding to the nozzle actuators 22 to be switched ON as shown in FIG. 8A, the variation in the total capacitance viewed from the digital power amplifier 28 side can be kept within the range of the capacitance of 90 nozzle actuators 22, in other words, the capacitance of one dummy load capacitor 27 as shown in FIG. 8B. Therefore, the load variation viewed from the digital power amplifier 28 side can be suppressed within the range of the capacitance of one dummy load capacitor.

As described above, according to the driving device of a capacitive load of the second embodiment, a plurality of dummy load capacitors 27 each having the same capacitance as the total capacitance of a plurality of nozzle actuators 22 is provided, and the selection switches 23 corresponding to the nozzle actuators 22 to be connected to the coil (the inductor) L and the selection switches 23 corresponding to the dummy load capacitors 27 are controlled to be ON or OFF so that the variation range of the total capacitance of the capacitance of the nozzle actuators 22 to be connected to the coil (the inductor) L and the dummy load capacitors 27 becomes equal to or smaller than the capacitance of one dummy load capacitor 27 in accordance with the number of selection switches 23 corresponding to the nozzle actuators 22 to be switched ON, thereby the variation in the total capacitance viewed from the digital power amplifier 28 side can be suppressed within a range of the capacitance of one dummy load capacitor 27, and further, it becomes possible to reduce the number of dummy load capacitors 27 to reduce the circuit scale.

Figure 9:
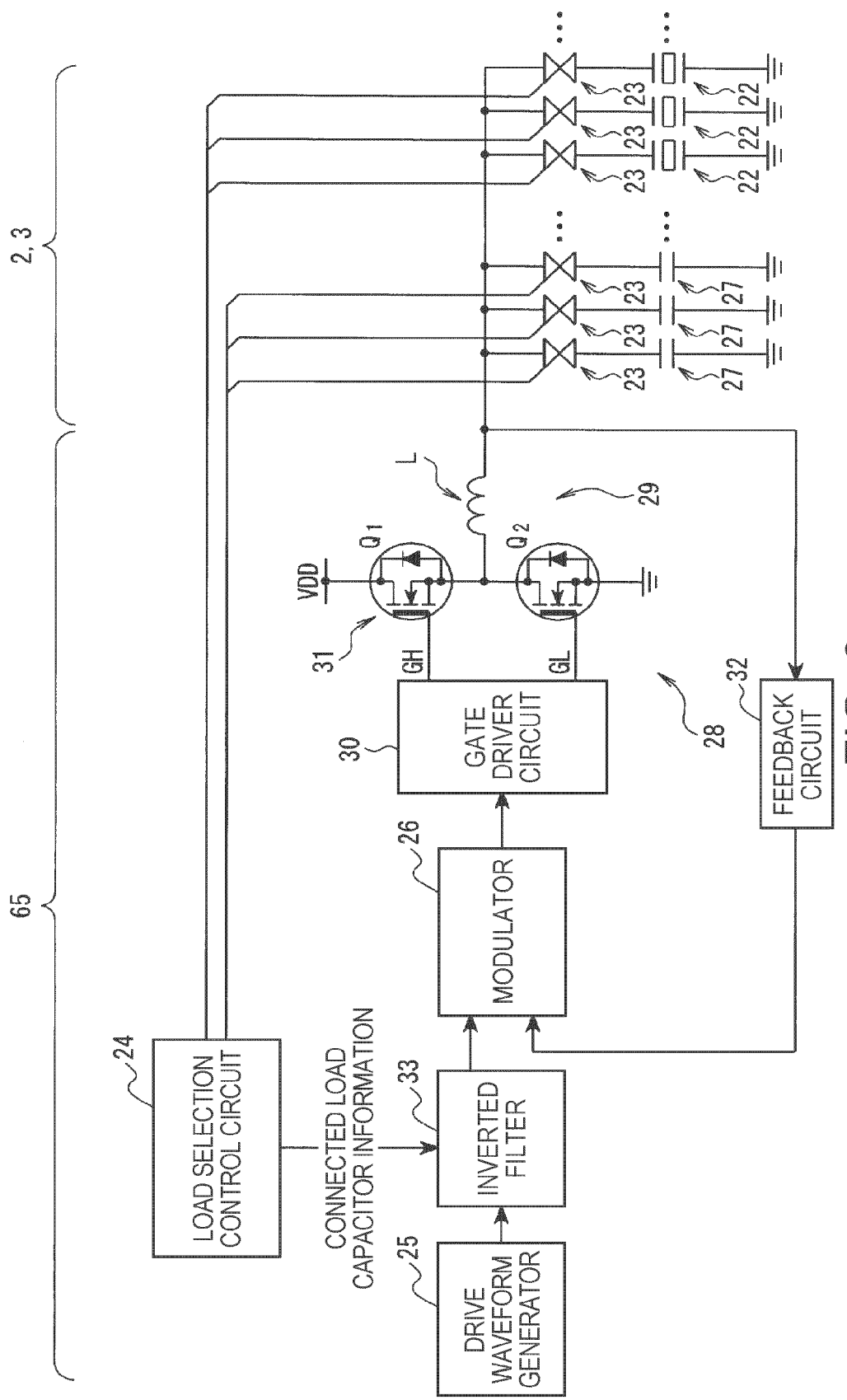
FIG. 9 is a block diagram showing a third embodiment of the driving device of a capacitive load.

Hereinafter, as the driving device of a capacitive load applied to the liquid jet printing apparatus of a third embodiment of the invention, FIG. 9 shows another example of a specific configuration of the head driver 65, the liquid jet heads 2, and the liquid jet heads 3. FIG. 9 includes a number of constituents identical to those of the configurations shown in FIGS. 4 and 7, and since those constituents essentially have substantially the same functions, the equivalent constituents are denoted with the equivalent numeral references, and the detailed explanation therefor will be omitted. The drive waveform signal generator 25, the modulator 26, the digital power amplifier 28, the low-pass filter 29 in the present embodiment have substantially the same functions as those shown in FIGS. 4 and 7, and the feedback circuit 32 having substantially the same function as that shown in FIG. 4 is adopted.

Further, also in the third embodiment, similarly to the case shown in FIG. 7, the dummy load capacitors 27 with different capacitances from the capacitance of the nozzle actuator 22 are adopted, and specifically, the dummy load capacitors 27 with the capacitances corresponding to the total capacitance of 90 nozzle actuators 22 are used. Further, the selection switch 23 is provided in correspondence with all of the capacitances of the nozzle actuators 22 and the dummy capacitors 27. The selection switches 23 are each formed of a transmission gate or the like, the ON/OFF control of the selection switches 23 by the load selection control circuit 24 is also the same as in the case shown in FIG. 7. Therefore, the selection control of the nozzle actuators 22 and the selection control of the dummy load capacitors 27 are performed for every drive pulse PCOM.

In the third embodiment, an inverted filter 33 is inserted between the drive waveform generator 25 and the modulator 26 of the embodiment shown in FIG. 7. The inverted filter 33 is for suppressing the variation in the total capacitance of the load viewed from the digital power amplifier 28 side, which appears as shown in FIG. 8A in the embodiment shown in FIG. 7. In the case with the third embodiment, since the capacitance of the dummy load capacitor 27 corresponds to the capacitance of 90 nozzle actuators 22, there is provided a configuration having a plurality of inverted filters so as to reduce the variation in the frequency characteristic of the drive signal COM (the drive pulse PCOM), namely reduce the waveform variation in the case in which the number of selection switches 23 corresponding to the nozzle actuators 22 to be switched ON varies from 1 to 90, and switching the inverted filters based on connected load capacitor information obtained from the load selection control circuit 24. Here, as shown in FIG. 8A, in the case in which the number of selection switches 23 corresponding to the nozzle actuators 22 to be switched ON is in a range of 0 through 90, the selection switches 23 corresponding to 3 dummy load capacitors 27 are switched ON, similarly, in the range of 91 through 180, the selection switches 23 corresponding to 2 dummy load capacitors 27 are switched ON, in the range of 181 through 270, the selection switch 23 corresponding to 1 dummy load capacitor 27 is switched ON, and in the range of 271 through 360, no selection switch 23 corresponding to the dummy load capacitor 27 is switched ON. Therefore, as shown in FIG. 8B, the total capacitance of the load viewed from the digital power amplifier 28 side has the same variation curves in the case in which the number of selection switches 23 corresponding to the nozzle actuators 22 to be switched ON varies from 0 to 90, in the case with the number varying from 90 to 180, in the case with the number varying from 180 to 270, and in the case with the number varying from 270 to 360. It should be noted that in the explanations described hereinafter, the nozzle actuators 22 and the selection switches 23 are simply referred to as loads, and the dummy load capacitors 27 and the selection switches 23 are simply referred to as dummy loads.

There are provided three inverted filters F1 through F3 having respective frequency characteristics different from each other, and the inverted filters are switched in accordance with the number of loads (the selection switches 23 of the nozzle actuators 22) to be switched ON so that the inverted filter F1 is used in the case in which the number of loads to be switched ON is in ranges of 0 through 30, 91 through 120, 181 through 210, and 271 through 300, the inverted filter F2 is used in the case in which the number of loads to be switched ON is in ranges of 31 through 60, 121 through 150, 211 through 240, and 301 through 330, and the inverted filter F3 is used in the case in which the number of loads to be switched ON is in ranges of 61 through 90, 151 through 180, 241 through 270, and 331 through 360. The variation range in the total capacitance of the loads and the dummy loads viewed from the digital power amplifier 28 side in the case of using the inverted filter F1 corresponds to that in the case in which the number of loads (the selection switches 23 of the nozzle actuators 22) to be switched ON varies from 270 to 300. The variation range in the total capacitance of the loads and the dummy loads viewed from the digital power amplifier 28 side in the case of using the inverted filter F2 corresponds to that in the case in which the number of loads to be switched ON varies from 301 to 330, and the variation range in the total capacitance of the loads and the dummy loads viewed from the digital power amplifier 28 side in the case of using the inverted filter F3 corresponds to that in the case in which the number of loads to be switched ON varies from 331 to 360.

Further, the frequency characteristics of the respective inverted filters F1 through F3 are set so that the frequency characteristics of the drive signal COM (the drive pulse PCOM) obtained in the cases of using the respective inverted filters F1 through F3 are as similar as possible.

Figure 10A:
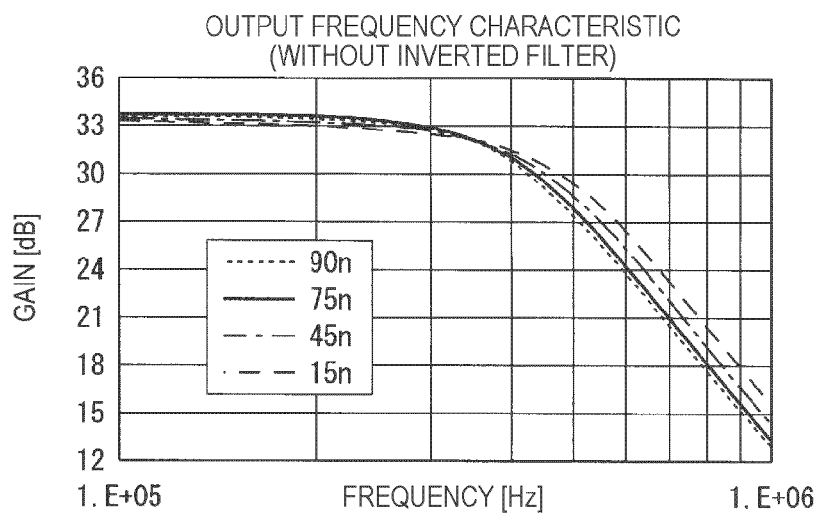
FIG. 10A is a diagram showing an example of a frequency characteristic of an output drive signal output from the driving device of a capacitive load shown in FIG. 7.

FIG. 10A shows an example of each of the frequency characteristics obtained without using the inverted filters F1 through F3, namely without executing the filtering process in the cases in which the number of loads varies from 0 to 30, from 31 to 60, from 61 to 90, respectively. It should be noted that FIG. 10A shows the frequency characteristic with 15 loads as a representative characteristic of the case in which the number of loads varies from 0 to 30, the frequency characteristic with 45 loads as a representative characteristic of the case in which the number of loads varies from 31 to 60, and the frequency characteristic with 75 loads as a representative characteristic of the case in which the number of loads varies from 61 to 90. As described above, when the number of capacitances of the nozzle actuators 22 as the loads varies from 0 to 90, the frequency characteristic of the drive signal COM (the drive pulse PCOM) varies as shown in FIG. 10A.

Figure 10B:
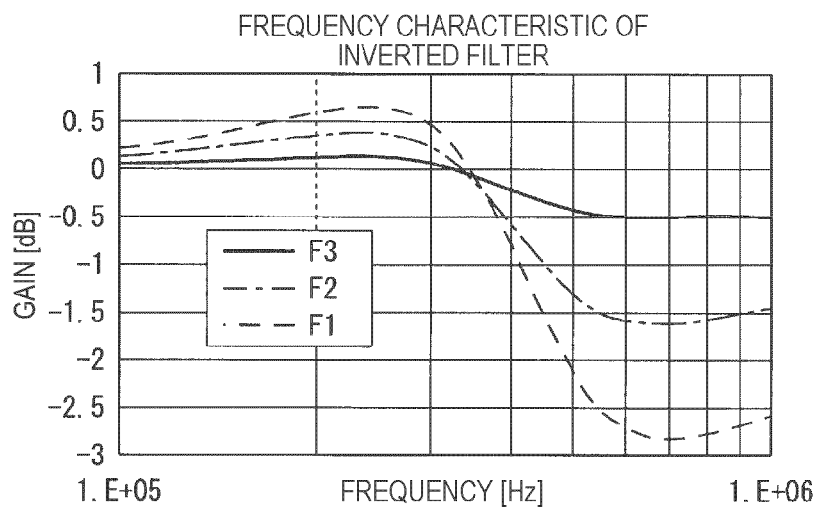
FIG. 10B is a diagram showing an example of a frequency characteristic of an inverted filter provided to the driving device of a capacitive load shown in FIG. 9.
Figure 10C:
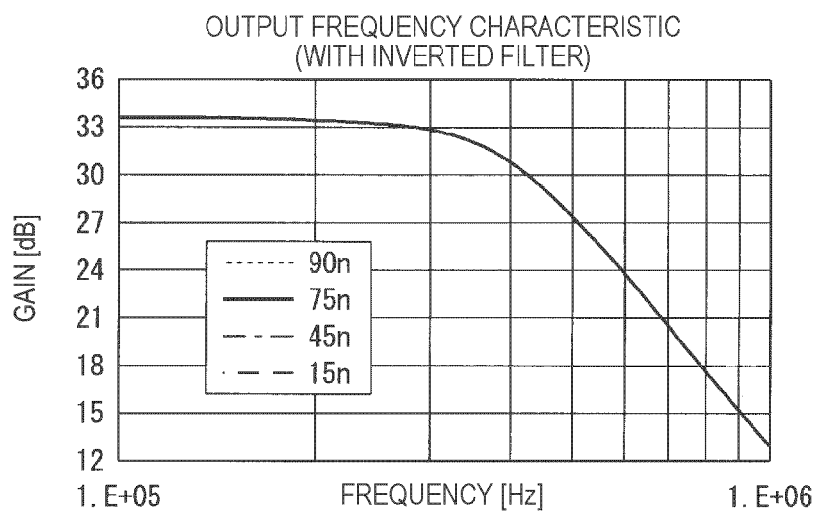
FIG. 10C is a diagram showing an example of a frequency characteristic of an output drive signal output from the driving device of a capacitive load shown in FIG. 9.

Therefore, the inverted filters F1, F2, and F3 are designed to have frequency characteristics for compensating the differences of the respective frequency characteristics of the drive signal COM (the drive pulse PCOM) with 15 loads, 45 loads, and 75 loads from the frequency characteristic of the drive signal COM (the drive pulse PCOM) with 90 loads as a reference frequency characteristic, for example, as shown in FIG. 10B. Further, the filtering process is performed while switching the inverted filters F1 through F3 in accordance with the number of loads to be switched ON. As described above, even in the case in which the frequency characteristic (the representative value) varies as shown in FIG. 10A in accordance with the variation in the number of loads from 0 to 90, by performing the inverted filter process as described above, it becomes possible to reduce the variation in the frequency characteristic as shown in FIG. 10C. By increasing the number of inverted filters corresponding to the number of nozzles to be switched ON, the variation can further be reduced. It should be noted that the curves of 15n, 45n, 75n, and 90n overlap with each other on one curve shown in FIG. 10C.

As described above, since the frequency characteristic of the drive signal COM (the drive pulse PCOM) can always be kept substantially constant with the inverted filters 33 (the inverted filters F1 through F3) even in the case in which the total capacitance of the loads viewed from the digital power amplifier 28 side varies, it becomes possible to suppress or prevent the characteristic variation of the drive signal COM (the drive pulse PCOM). Further, since the variation range of the total capacitance of the loads viewed from the digital power amplifier 28 side can be reduced using the plurality of dummy load capacitors 27, the number of inverted filters used can be reduced, thus the growth in the circuit scale can also be prevented.

As described above, according to the driving device of a capacitive load of the third embodiment, in the case in which the frequency characteristic of the passing band of the drive signal COM (the drive pulse PCOM) output from the coil (the inductor) L to the nozzle actuators 22 varies in accordance with the variation in the total capacitance of the capacitance of the nozzle actuators 22 and the dummy load capacitors 27 connected to the coil (the inductor) L caused by the combination of the selections of the nozzle actuators 22 and the dummy load capacitors 27 connected to the coil (the inductor) L, by providing the inverted filters 33 for executing the filtering process on the drive waveform signal WCOM so as to reduce the variation in the frequency characteristic of the passing band of the drive signal COM (the drive pulse PCOM) based on the connection information of the nozzle actuators 22 and the dummy load capacitors 27 to be connected to the coil (the inductor) L by the load selection control circuit 24, it becomes possible to suppress or prevent the characteristic variation in the drive signal COM (the drive pulse PCOM) while reducing the number of dummy load capacitors 27 and the circuit scale.

It should be noted that although in the first through the third embodiments, the case in which the driving device of the of a capacitive load according to the invention is applied to the line head printing apparatus is only described in detail, the driving device of a capacitive load according to the invention can also be applied to multi-pass printing apparatuses in a similar manner.

Further, the driving device of a capacitive load according to the invention can be applied not only to the liquid jet printing apparatus as described in the above embodiments, but also to driving of any kind of capacitive load providing the drive signal for driving the capacitive load is amplified by a digital power amplifier.

Further, although in the first through the third embodiments, the liquid jet device according to the invention is embodied as the inkjet printing apparatus, this is not the limitation, and the liquid jet device according to the invention can also be embodied as a liquid jet device for ejecting or emitting a jet of a liquid (including a liquid like member dispersing particles of functional materials, and a fluid such as a gel besides liquids) other than the ink or a fluid (e.g., a solid substance capable of flowing and being emitted as a jet) other than liquids. The liquid jet device can be, for example, a liquid jet device for emitting a jet of a liquid including a material such as an electrode material or a color material used for manufacturing of a liquid crystal display, an electroluminescence (EL) display, a plane emission display, or a color filter in a form of a dispersion or a solution, a liquid jet device for emitting a jet of a living organic material used for manufacturing a biochip, or a liquid jet device used as a precision pipette for emitting a jet of a liquid to be a sample. Further, the liquid jet device can be a liquid jet device for emitting a jet of lubricating oil to a precision machine such as a timepiece or a camera in a pinpoint manner, a liquid jet device for ejecting transparent resin on a substrate such as ultraviolet curing resin for forming a fine hemispherical lens (optical lens) used for an optical communication element, a liquid jet device for emitting a jet of an etching liquid of an acid or an alkali for etching a substrate, a liquid jet device for emitting a gel jet, or a fluid jet recording device for emitting a jet of a solid substance including fine particles such as a toner as an example. Further, the invention can be applied to either one of these jet devices.

The entire disclosure of Japanese Patent Application No. 2007-308555 filed on Nov. 29, 2007 is expressly incorporated by reference herein.

What is claimed is:

1. A driving device of a capacitive load comprising:
   a modulator adapted to execute pulse modulation on a drive waveform signal;
   a digital power amplifier adapted to power-amplify the modulated signal obtained by the modulator with a pair of switching elements push-pull connected to each other;
   an inductor adapted to low-pass filter the amplified digital signal obtained by the digital power amplifier and output the low-pass filtered signal as a drive signal towards at least one load capacitor as the capacitive load;
   at least one dummy load capacitor;
   a load selection control circuit adapted to select the load capacitor and the dummy load capacitor to be connected to the inductor, respectively, so that a sum of a capacitance of the load capacitor and a capacitance of the dummy load capacitor to be connected to the inductor is kept within a predetermined range; and
   a feedback circuit adapted to execute a filtering process on the drive signal so that a frequency characteristic of a passing band of the drive signal output from the inductor to the load capacitor becomes substantially flat, and feedback the signal obtained to the modulator as a feedback signal,
   wherein the modulator executes the pulse modulation on a difference value between the drive waveform signal and the feedback signal.

2. The driving device of a capacitive load according to claim 1, wherein
   the feedback circuit leads a phase in a band in the vicinity of a resonant frequency of a low-pass filter composed mainly of the inductor, the load capacitor, and the dummy load capacitor.

3. The driving device of a capacitive load according to claim 1, wherein
   the dummy load capacitor and the load capacitor has the same capacitance as each other, and the number of dummy load capacitors is the same as the number of load capacitors, and
   one of the load capacitors, one of the dummy load capacitors, and a selection switch adapted to switch between the one of the load capacitors and the one of the dummy load capacitors form a unit load.

4. The driving device of a capacitive load according to claim 1, wherein
   the dummy load capacitor has a capacitance equal to a total capacitance of a plurality of load capacitors, and the number (K) of dummy load capacitors is larger than one,
   the load selection control circuit is configured to select N ($0 \leq N \leq M$) load capacitors out of all (M) of the load capacitors to connect the selected load capacitors to the inductor, and further select D ($0 \leq D \leq K$) dummy load capacitors out of the K dummy load capacitors to connect the selected dummy load capacitors to the inductor, and
   the load selection control circuit is further configured to select the load capacitors and the dummy load capacitors to be connected to the inductor, respectively, so that a variation range in a total capacitance of the N load capacitors and the D dummy load capacitors does not exceed a capacitance of one dummy load capacitor in the case in which the number (N) of the load capacitors connected to the inductor varies from 0 to M.

5. The driving device of a capacitive load according to claim 4, further comprising:
   at least one inverted filter adapted to execute a filtering process on the drive waveform signal so as to reduce a variation in a frequency characteristic of a passing band of the drive signal based on connection information of the load capacitors and the dummy load capacitors to be connected to the inductor by the load selection control circuit, in the case in which the frequency characteristic of the passing band of the drive signal output from the inductor to the load capacitors varies in accordance with the variation in the total capacitance of the load capacitors and the dummy load capacitors connected to the inductor caused by a combination of selections of the load capacitors and the dummy load capacitors connected to the inductor.

6. The driving device of a capacitive load according to claim 1, wherein
the inductor and the load capacitors are connected without a damping resistor intervening in between.

7. The driving device of a capacitive load according to claim 1, wherein
the load capacitors are piezoelectric elements corresponding to respective nozzles of a liquid jet head.

8. A driving method of a capacitive load comprising:
modulating a drive waveform signal;
power-amplifying the modulated signal in the modulation step by a pair of switching elements push-pull connected to each other;
outputting the amplified digital signal obtained in the power-amplifying step as a drive signal towards at least one load capacitor as the capacitive load after low-pass filtering the amplified digital signal with an inductor;
selecting the load capacitor and a dummy load capacitor to be connected to the inductor, respectively, so that a sum of a capacitance of the load capacitor and a capacitance of the dummy load capacitor to be connected to the inductor is kept within a predetermined range;
feeding-back the drive signal as a feedback signal after executing a filtering process on the drive signal so that a frequency characteristic of a passing band of the drive signal output from the inductor to the load capacitor becomes substantially flat; and
pulse-modulating a difference value between the drive waveform signal and the feedback signal.

9. A liquid jet printing apparatus comprising a driving device of a capacitive load including:
a modulator adapted to execute pulse modulation on a drive waveform signal;
a digital power amplifier adapted to power-amplify the modulated signal obtained by the modulator with a pair of switching elements push-pull connected to each other;
an inductor adapted to low-pass filter the amplified digital signal obtained by the digital power amplifier and output the low-pass filtered signal as a drive signal towards at least one load capacitor as the capacitive load;
at least one dummy load capacitor;
a load selection control circuit adapted to select the load capacitor and the dummy load capacitor to be connected to the inductor, respectively, so that a sum of a capacitance of the load capacitor and a capacitance of the dummy load capacitor to be connected to the inductor is kept within a predetermined range; and
a feedback circuit adapted to execute a filtering process on the drive signal so that a frequency characteristic of a passing band of the drive signal output from the inductor to the capacitor becomes substantially flat, and feedback the signal obtained to the modulator as a feedback signal,
wherein the modulator executes the pulse modulation on a difference value between the drive waveform signal and the feedback signal.

* * * * *